(12) United States Patent
Cheng (10) Patent No.: US 11,699,761 B2
(45) Date of Patent: Jul. 11, 2023

(54) THIN FILM TRANSISTOR AND FABRICATION METHOD THEREOF, ARRAY SUBSTRATE AND FABRICATION METHOD THEREOF, AND DISPLAY PANEL

(71) Applicants: Beijing BOE Technology Development Co., Ltd., Beijing (CN); BOE TECHNOLOGY GROUP CO., LTD., Beijing (CN)

(72) Inventor: Hongfei Cheng, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 218 days.

(21) Appl. No.: 17/417,514

(22) PCT Filed: Nov. 5, 2020

(86) PCT No.: PCT/CN2020/126674
§ 371 (c)(1),
(2) Date: Jun. 23, 2021

(87) PCT Pub. No.: WO2021/088912
PCT Pub. Date: May 14, 2021

(65) Prior Publication Data
US 2022/0115540 A1   Apr. 14, 2022

(30) Foreign Application Priority Data

Nov. 6, 2019  (CN) .......................... 201911077318.9

(51) Int. Cl.
*H01L 29/786*  (2006.01)
*H01L 29/417*  (2006.01)
*H01L 29/66*   (2006.01)

(52) U.S. Cl.
CPC .. *H01L 29/78672* (2013.01); *H01L 29/41733* (2013.01); *H01L 29/6675* (2013.01); *H01L 29/78663* (2013.01)

(58) Field of Classification Search
CPC ......... H01L 29/78672; H01L 29/41733; H01L 29/6675; H01L 29/78663; H01L 29/78621;
(Continued)

(56) References Cited

U.S. PATENT DOCUMENTS 7,763,479 B2    7/2010  Chiu et al.
2016/0181437 A1*  6/2016  Bu ........................ H01L 29/167
                                                   257/66

FOREIGN PATENT DOCUMENTS

CN      1527381 A    9/2004
CN      1612358 A    5/2005
(Continued)

OTHER PUBLICATIONS

China Patent Office, CN201911077318.9 First Office Action dated Dec. 3, 2021.

*Primary Examiner* — Mohammed R Alam
(74) *Attorney, Agent, or Firm* — Houtteman Law LLC (57) ABSTRACT

The present disclosure provides a thin film transistor and a fabrication method thereof, an array substrate and a fabrication method thereof, and a display panel. The method for fabricating a thin film transistor includes: forming an active layer including a first region, a second region and a third region on a substrate; forming a gate insulating layer on a side of the active layer away from the substrate; forming a gate electrode on a side of the gate insulating layer away from the active layer; and ion-implanting the active layer from a side of the gate electrode away from the active layer, so that the first region is formed into a heavily doped region,
(Continued)

the second region is formed into a lightly doped region, and the third region is formed into an active region.

19 Claims, 4 Drawing Sheets

(58) Field of Classification Search
 CPC ............... H01L 29/06; H01L 29/42384; H01L 29/66757; H01L 29/78675; H01L 27/1222; H01L 27/1288; H01L 29/0684
 See application file for complete search history.

(56) References Cited

FOREIGN PATENT DOCUMENTS

| CN | 103779206 A | 5/2014 |
| CN | 106952963 A | 7/2017 |
| CN | 109616479 A | 4/2019 |
| CN | 109950320 A | 6/2019 |
| CN | 110349859 A | 10/2019 |
| KR | 20130117053 A | 10/2013 |

* cited by examiner

THIN FILM TRANSISTOR AND FABRICATION METHOD THEREOF, ARRAY SUBSTRATE AND FABRICATION METHOD THEREOF, AND DISPLAY PANEL

CROSS-REFERENCE TO RELATED APPLICATION

This is a National Phase Application filed under 35 U.S.C. 371 as a national stage of PCT/CN2020/126674, filed on Nov. 5, 2020, an application claiming the benefit of priority to Chinese Patent Application No. 201911077318.9 filed on Nov. 6, 2019 to China National Intellectual Property Administration, the contents of which are incorporated herein in their entirety by reference.

TECHNICAL FIELD

The present disclosure belongs to the field of display technology, and particularly relates to a thin film transistor and a fabrication method thereof, an array substrate and a fabrication method thereof, and a display panel.

BACKGROUND

Display devices such as liquid crystal displays (LCDs) and organic light emitting diode (OLED) displays have been widely used. LCD and OLED display devices use thin film transistors (TFTs) to control pixels in a display panel. Examples of the TFT include an amorphous silicon TFT, a polycrystalline silicon TFT, a monocrystalline silicon TFT, and a metal oxide TFT.

SUMMARY

In one aspect, the present disclosure provides a method for fabricating a thin film transistor, including: forming an active layer on a substrate, the active layer including a first region, a second region, and a third region; forming a gate insulating layer on a side of the active layer away from the substrate; forming a gate electrode on a side of the gate insulating layer away from the active layer, wherein an orthographic projection of the first region of the active layer on the substrate does not overlap with an orthographic projection of the gate insulating layer on the substrate and an orthographic projection of the gate electrode on the substrate, an orthographic projection of the second region of the active layer on the substrate overlaps with the orthographic projection of the gate insulating layer on the substrate but does not overlap with the orthographic projection of the gate electrode on the substrate, and an orthographic projection of the third region of the active layer on the substrate overlaps with both the orthographic projection of the gate insulating layer on the substrate and the orthographic projection of the gate electrode on the substrate; and performing ion implantation on the active layer from a side of the gate electrode away from the active layer, so that the first region of the active layer is formed into a heavily doped region, the second region of the active layer is formed into a lightly doped region, and the third region of the active layer is formed into an active region.

In some embodiments, an energy of the ion implantation is 10 to 100 KeV, and a dose of the ion implantation is less than $2 \times 10^{18}$ atom/cm$^3$.

In some embodiments, a doping concentration of the lightly doped region ranges from $1 \times 10^{12}$ to $1 \times 10^{14}$ atom/cm$^2$, and a doping concentration of the heavily doped region ranges from $1 \times 10^{14}$ to $1 \times 10^{16}$ atom/cm$^2$.

In some embodiments, the active layer is made of low temperature polysilicon.

In some embodiments, forming the gate insulating layer further includes forming a plurality of through holes penetrating the gate insulating layer in a region of the gate insulating layer not overlapping with the gate electrode in a direction perpendicular to the substrate, and the through holes have an aperture in a range of 1 to 4 µm.

In some embodiments, the plurality of through holes are uniformly distributed, and a total open area of all the through holes is less than 30% of an area of the lightly doped region.

In some embodiments, a width between a boundary of the lightly doped region close to the active region and a boundary of the lightly doped region close to the heavily doped region ranges from 1.5 to 6 µm.

In some embodiments, a common boundary between the lightly doped region and the active region is formed to be aligned with a boundary of the gate electrode.

In some embodiments, a common boundary between the heavily doped region and the lightly doped region is formed to be aligned with a boundary of the gate insulating layer.

In some embodiments, the gate electrode is made of one or an alloy material of two or more of copper, aluminum, molybdenum, titanium, chromium and tungsten; the gate insulating layer is made of silicon nitride or silicon oxide.

In some embodiments, forming the active layer on the substrate includes:

forming a pattern of an amorphous silicon active film on the substrate; and crystallizing the pattern of the amorphous silicon active film by laser to form the active layer of low temperature polysilicon.

In some embodiments, forming the gate insulating layer on the side of the active layer away from the substrate, and forming the gate electrode on the side of the gate insulating layer away from the active layer include: forming a gate insulating film on the side of the active layer away from the substrate; forming a gate film on a side of the gate insulating film away from the active layer; forming a first photoresist layer on a side of the gate film away from the gate insulating film; etching the gate film and the gate insulating film to remove portions of the gate film and the gate insulating film which are not shielded by the first photoresist layer so as to form the gate insulating layer; forming a second photoresist layer on the side of the gate film away from the gate insulating layer; and etching the gate film to remove a portion of the gate film which is not shielded by the second photoresist layer so as to form the gate electrode.

In some embodiments, the method further includes: forming a third photoresist layer on a side of the gate electrode away from the gate insulating layer, wherein a plurality of micro holes are formed in a region of the third photoresist layer which overlaps with the lightly doped region in a direction perpendicular to the substrate; and etching the gate insulating layer to form a plurality of through holes penetrating the gate insulating layer in a region of the gate insulating layer which does not overlap with the gate electrode in the direction perpendicular to the substrate.

In some embodiments, after the ion implantation is performed, the method further includes: forming an interlayer insulating layer on the side of the gate electrode away from the active layer, and forming a first via hole and a second via hole in the interlayer insulating layer, wherein the first via hole and the second via hole expose the heavily doped region; and forming a source electrode and a drain electrode on a side of the interlayer insulating layer away from the gate electrode, wherein the source electrode is connected to the heavily doped region through the first via hole, and the drain electrode is connected to the heavily doped region through the second via hole.

In another aspect, the present disclosure provides a thin film transistor, including: a substrate; an active layer on the substrate, the active layer including a heavily doped region, a lightly doped region, and an active region; a gate insulating layer on a side of the active layer away from the substrate; and a gate electrode on a side of the gate insulating layer away from the active layer. An orthographic projection of the heavily doped region on the substrate does not overlap with an orthographic projection of the gate insulating layer on the substrate and an orthographic projection of the gate electrode on the substrate, an orthographic projection of the lightly doped region on the substrate overlaps with the orthographic projection of the gate insulating layer on the substrate but does not overlap with the orthographic projection of the gate electrode on the substrate, and an orthographic projection of the active region on the substrate overlaps with both the orthographic projection of the gate insulating layer on the substrate and the orthographic projection of the gate electrode on the substrate. A common boundary between the lightly doped region and the active region is aligned with a boundary of the gate electrode, and a common boundary between the heavily doped region and the lightly doped region is aligned with a boundary of the gate insulating layer.

In some embodiments, a doping concentration of the lightly doped region ranges from $1 \times 10^{12}$ to $1 \times 10^{14}$ atom/$cm^2$, and a doping concentration of the heavily doped region ranges from $1 \times 10^{14}$ to $1 \times 10^{16}$ atom/$cm^2$.

In some embodiments, the thin film transistor further includes: an interlayer insulating layer on a side of the gate electrode away from the active layer, a first via hole and a second via hole being in the interlayer insulating layer and exposing the heavily doped region, and a source electrode and a drain electrode on a side of the interlayer insulating layer away from the gate electrode, wherein the source electrode is connected to the heavily doped region through the first via hole, and the drain electrode is connected to the heavily doped region through the second via hole.

In another aspect, the present disclosure provides a method for fabricating an array substrate, including: forming a thin film transistor in the array substrate by adopting the method for fabricating the thin film transistor according to the present disclosure.

In another aspect, the present disclosure provides an array substrate including the thin film transistor according to the present disclosure.

In another aspect, the present disclosure provides a display panel including the array substrate according to the present disclosure.

DETAILED DESCRIPTION

In order to make those skilled in the art better understand technical solutions of the present disclosure, a thin film transistor and a fabrication method thereof, an array substrate and a fabrication method thereof, and a display panel of the present disclosure are described in further detail below with reference to the accompanying drawings and the embodiments.

As the size of low temperature polysilicon thin film transistor (LTPS TFT) devices continues to decrease, the LTPS TFT has a significant short channel effect mainly due to a strong electric field at the drain electrode, and the resulting effects such as hot carriers will affect the reliability and stability of the devices.

Therefore, to fabricate a low temperature polysilicon thin film transistor, it is necessary to form a heavily doped region and a lightly doped region in its active layer. In the conventional fabrication process, the heavily doped region and the lightly doped region need to be formed by different doping processes respectively, the fabrication process is complex, and the fabrication efficiency of the low-temperature polycrystalline silicon thin film transistor is greatly limited.

Figure 1:
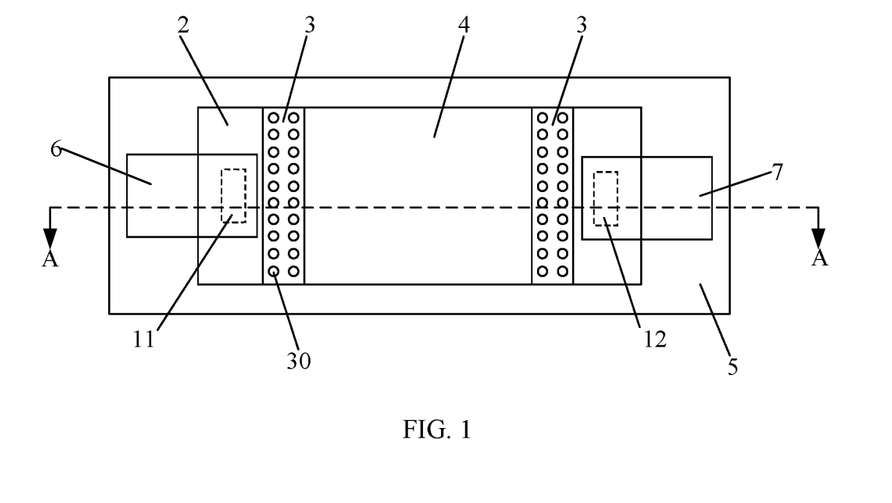
FIG. 1 is a top view of a structure of a transistor according to an embodiment of the present disclosure.
Figure 2:
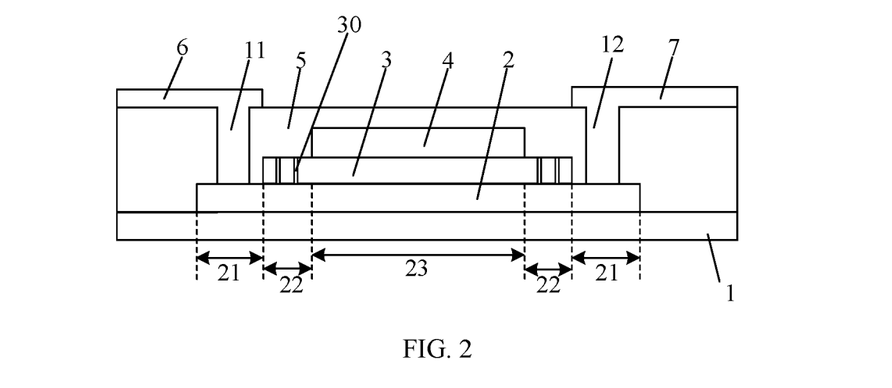
FIG. 2 is a cross-sectional view of the transistor shown in FIG. 1 taken along line AA.

The embodiments of the present disclosure provide a method for fabricating a thin film transistor, as shown in FIG. 1 and FIG. 2, including: forming an active layer 2 on a substrate 1, the active layer 2 including a first region 21, a second region 22, and a third region 23; forming a gate insulating layer 3 on a side of the active layer 2 away from the substrate 1; forming a gate electrode 4 on a side of the gate insulating layer 3 away from the active layer 2, wherein an orthographic projection of the first region 21 of the active layer 2 on the substrate 1 does not overlap with an orthographic projection of the gate insulating layer 3 on the substrate 1 and an orthographic projection of the gate electrode 4 on the substrate 1, an orthographic projection of the second region 22 of the active layer 2 on the substrate 1 overlaps with the orthographic projection of the gate insulating layer 3 on the substrate 1 but does not overlap with the orthographic projection of the gate electrode 4 on the substrate 1, and an orthographic projection of the third region 23 of the active layer 2 on the substrate 1 overlaps with both the orthographic projection of the gate insulating layer 3 on the substrate 1 and the orthographic projection of the gate electrode 4 on the substrate 1; and ion-implanting the active layer 2 from a side of the gate electrode 4 facing away from the active layer 2 such that the first region 21 of the active layer 2 is formed as a heavily doped region, the second region 22 of the active layer 2 is formed as a lightly doped region, and the third region 23 of the active layer 2 is formed as an active region. In some embodiments, after the ion implantation, the method for fabricating a thin film transistor further includes: forming an interlayer insulating layer 5 on the side of the gate electrode 4 away from the active layer 2, and forming a first via hole 11 and a second via hole 12 in the interlayer insulating layer 5, the first via hole 11 and the second via hole 12 exposing the heavily doped region 21; and forming a source electrode 6 and a drain electrode 7 on a side of the interlayer insulating layer 5 away from the gate electrode 4, the source electrode 6 being connected to the heavily doped region 21 through the first via hole 11, and the drain electrode 7 being connected to the heavily doped region 21 through the second via hole 12.

When the active layer 2 is ion-implanted from the side of the gate electrode 4 facing away from the active layer 2, no ion is implanted into a portion of the active layer 2 that is shielded by both the gate insulating layer 3 and the gate electrode 4, thereby forming the active region 23 of the active layer 2; ions are partially implanted into a portion of the active layer 2 shielded by the gate insulating layer 3 but not by the gate electrode 4, thereby forming the lightly doped region 22 of the active layer 2; ions are sufficiently implanted into the fully exposed portion of the active layer 2, which is not shielded by the gate insulating layer 3 or the gate electrode 4, thereby forming the heavily doped region 21 of the active layer 2.

In the method for fabricating the thin film transistor, by performing ion implantation on the active layer 2 from the side of the gate electrode 4 away from the active layer 2 after the gate electrode 4 is formed and before the interlayer insulating layer 5 is formed, the heavily doped region 21, the lightly doped region 22, and the active region 23 of the active layer 2 can be simultaneously formed using the gate electrode 4 and the gate insulating layer 3 that have been formed as a mask. Compared with the case that the heavily doped region and the lightly doped region of the thin film transistor need to be formed respectively through different doping processes, the fabrication method according to the embodiments of the present disclosure greatly simplifies the fabrication process of the thin film transistor and improves the fabrication efficiency of the thin film transistor.

In the embodiment of the present disclosure, the active layer 2 is made of low temperature polysilicon. In some embodiments, the ion implantation energy is 10 to 100 KeV, and the ion implantation dose is less than $2\times10^{18}$ atom/cm$^3$. With the ion implantation energy and the ion implantation dose, the heavily doped region 21, the lightly doped region 22, and the active region 23 of the active layer 2 can be simultaneously formed by using the gate electrode 4 and the gate insulating layer 3 as a mask during the process of ion implantation to form the heavily doped region 21, the lightly doped region 22, and the active region 23 of the active layer 2, thereby simplifying the fabrication process of the thin film transistor and improving the fabrication efficiency of the thin film transistor.

In the embodiment of the present disclosure, the doping concentration of the lightly doped region 22 ranges from $1\times10^{12}$ to $1\times10^{14}$ atom/cm$^2$, and the doping concentration of the heavily doped region 21 ranges from $1\times10^{14}$ to $1\times10^{16}$ atom/cm$^2$. A width between a boundary of the lightly doped region 22 close to the active region 23 and a boundary of the lightly doped region 22 close to the heavily doped region 21 ranges from 1.5 to 6 μm. The heavily doped region 21 having a doping concentration in this range has good conductivity, and can achieve good electrical conductivity between the source and drain electrodes 6 and 7 and the heavily doped region 21. The lightly doped region 22 having a doping concentration and a width in the above ranges can well solve the problem of poor reliability and stability of the thin film transistor resulting from the effect such as hot carriers caused by the strong electric field at the source and drain electrodes 6 and 7, and ensure the reliability and stability of the thin film transistor.

In some embodiments, a boundary between the lightly doped region 22 and the active region 23 is formed to be aligned with a boundary of the gate electrode 4, and/or a boundary between the heavily doped region 21 and the lightly doped region 22 is formed to be aligned with a boundary of the gate insulating layer 3.

In the embodiment of the present disclosure, forming the gate insulating layer 3 further includes forming a plurality of through holes 30 penetrating the gate insulating layer 3 in a region of the gate insulating layer 3 corresponding to the lightly doped region 22 (i.e., a region not overlapping with the gate electrode 4 in a direction perpendicular to the substrate 1), and the through holes 30 have an aperture in a range of 1 to 4 μm. In some embodiments, the plurality of through holes 30 are uniformly distributed, and a total open area of all through holes 30 is less than 30% of an area of the lightly doped region 22. By forming the through holes 30 in the region of the gate insulating layer 3 corresponding to the lightly doped region 22, it is helpful to better adjust the ion concentration of the lightly doped region 22 in the process of forming the lightly doped region 22 by ion implantation, so that the ions are partially implanted into the active layer 2 after passing through the gate insulating layer 3, thereby forming the lightly doped region 22 having a doping concentration in the above range, and further facilitating the lightly doped region 22 to better meet the performance requirement; meanwhile, the ion implantation energy can be reduced, so that the damage of the ion implantation to the structure of the active layer 2 is reduced.

In some embodiments, the gate electrode 4 is made of one or an alloy material of two or more of copper, aluminum, molybdenum, titanium, chromium, and tungsten; the gate insulating layer 3 is made of silicon nitride or silicon oxide. The gate electrode 4 has a single-layer or multi-layer structure. For example, the gate electrode 4 may have a three-layer structure of Mo\Al\Mo, Ti\Cu\Ti, or Mo\Ti\Cu. The gate insulating layer 3 has a single-layer or multi-layer structure. For example, the gate insulating layer 3 may have a two-layer structure of silicon oxide \ silicon nitride.

In addition, the source electrode 6 and the drain electrode 7 may be made of the same material and have the same structure as the gate electrode 4, and the interlayer insulating layer 5 may be made of the same material and have the same structure as the gate insulating layer 3.

FIGS. 3 to 11 show a process of fabricating a thin film transistor using the method for fabricating a thin film transistor according to the embodiments of the present disclosure.

Figure 3:
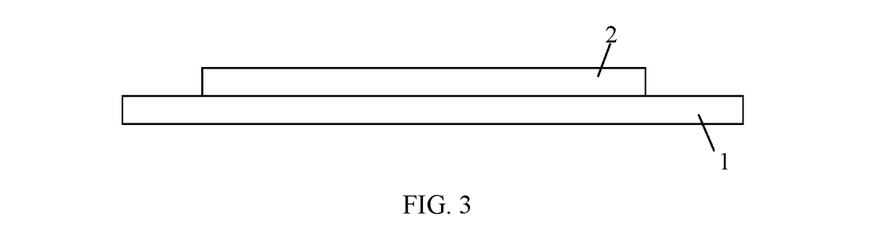
FIG. 3 is a cross-sectional view of a structure of a transistor after completion of step S01 in a method for fabricating the transistor according to an embodiment of the present disclosure.

In step S01, as shown in FIG. 3, a pattern of an amorphous silicon active film is formed on the substrate 1, and the amorphous silicon active film is crystallized by laser to form a low-temperature polysilicon active layer 2.

Figure 4:
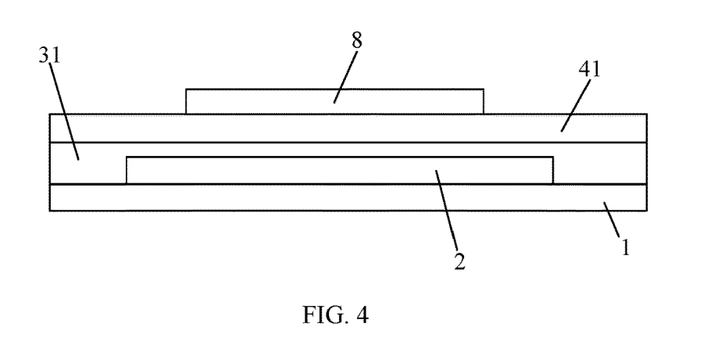
FIG. 4 is a cross-sectional view of a structure of the transistor after completion of step S02 in the method for fabricating the transistor according to the embodiment of the present disclosure.

In step S02, as shown in FIG. 4, on the substrate 1 subjected to step S01, a gate insulating film 31 is formed on a side of the active layer 2 away from the substrate 1, a gate film 41 is formed on a side of the gate insulating film 31 away from the active layer 2, a photoresist film is formed on a side of the gate film 41 away from the gate insulating film 31, the photoresist film is exposed and developed to form a pattern of a first photoresist layer 8, and a boundary of the first photoresist layer 8 is aligned with a common boundary of the heavily doped region and the lightly doped region to be formed of the active layer 2.

Figure 5:
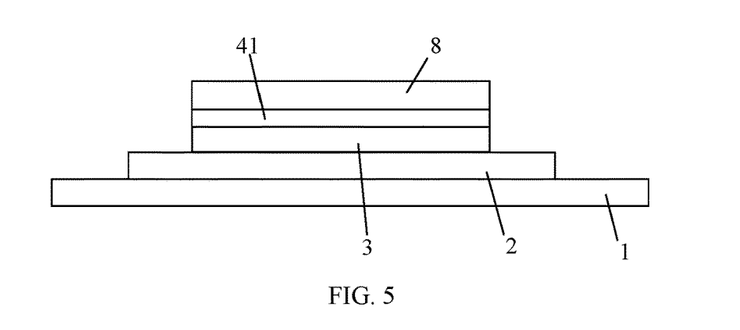
FIG. 5 is a cross-sectional view of a structure of the transistor after completion of step S03 in the method for fabricating the transistor according to the embodiment of the present disclosure.

In step S03, as shown in FIG. 5, the gate film 41 and the gate insulating film 31 are etched to remove portions of the gate film 41 and the gate insulating film 31 that are not shielded by the first photoresist layer 8, thereby forming a pattern of the gate insulating layer 3. After step S03 is completed, the first photoresist layer 8 may be stripped off.

Figure 6:
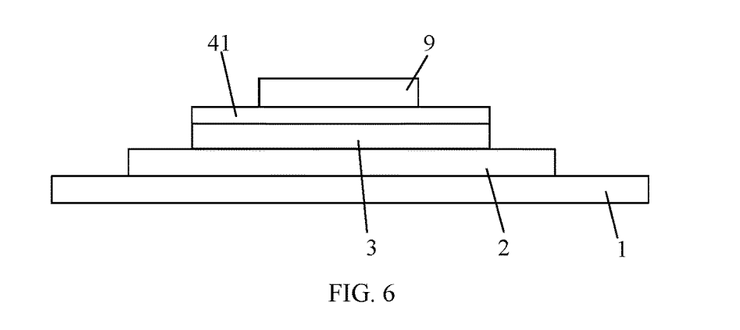
FIG. 6 is a cross-sectional view of a structure of the transistor after completion of step S04 in the method for fabricating the transistor according to the embodiment of the present disclosure.

In step S04, as shown in FIG. 6, a photoresist film is formed on a side of the gate film 41 away from the gate insulating layer 3, and a pattern of a second photoresist layer 9 is formed by exposing and developing the photoresist film, and a boundary of the second photoresist layer 9 is aligned with a common boundary of the active region and the lightly doped region to be formed of the active layer 2. In some embodiments, the second photoresist layer 9 may be formed from the first photoresist layer 8. For example, the first photoresist layer 8 may have a step shape, and after step S03 is completed, the first photoresist layer 8 may be subjected to ashing to obtain the second photoresist layer 9.

Figure 7:
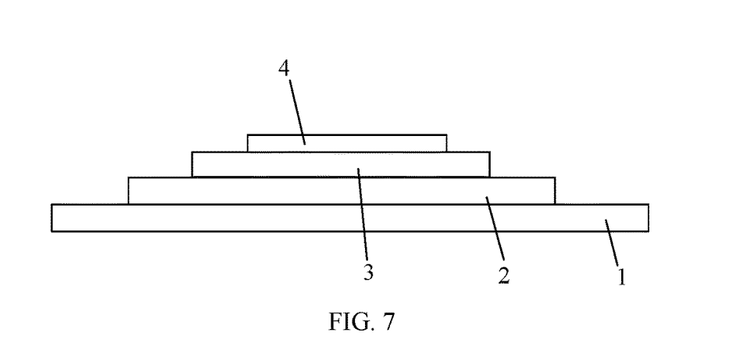
FIG. 7 is a cross-sectional view of a structure of the transistor after completion of step S05 in the method for fabricating the transistor according to the embodiment of the present disclosure.

In step S05, as shown in FIG. 7, the gate film 41 is etched to remove a portion of the gate film 41 not shielded by the second photoresist layer 9, thereby forming a pattern of the gate electrode 4. After step S05 is completed, the second photoresist layer 9 may be stripped off.

Figure 8:
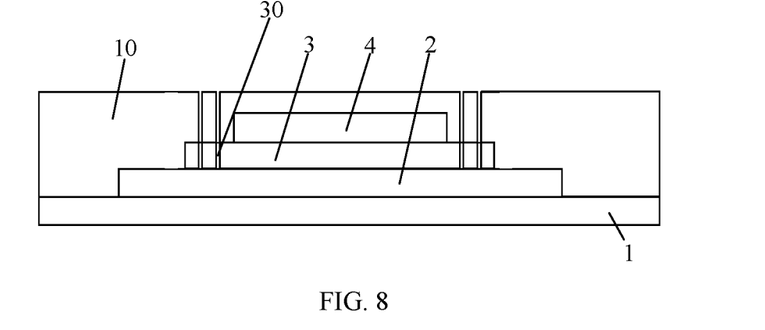
FIG. 8 is a cross-sectional view of a structure of the transistor after completion of step S06 in the method for fabricating the transistor according to the embodiment of the present disclosure.

In step S06, as shown in FIG. 8, a photoresist film is formed on a side of the gate electrode 4 away from the gate insulating layer 3, a pattern of a third photoresist layer 10 is formed by exposing and developing the photoresist film, a plurality of micro holes are formed in a region of the third photoresist layer 10 corresponding to the lightly doped region, and the gate insulating layer 3 is etched to form a plurality of through holes 30 in a region of the gate insulating layer 3 corresponding to the lightly doped region. After step S06 is completed, the third photoresist layer 10 may be stripped off.

Figure 9:
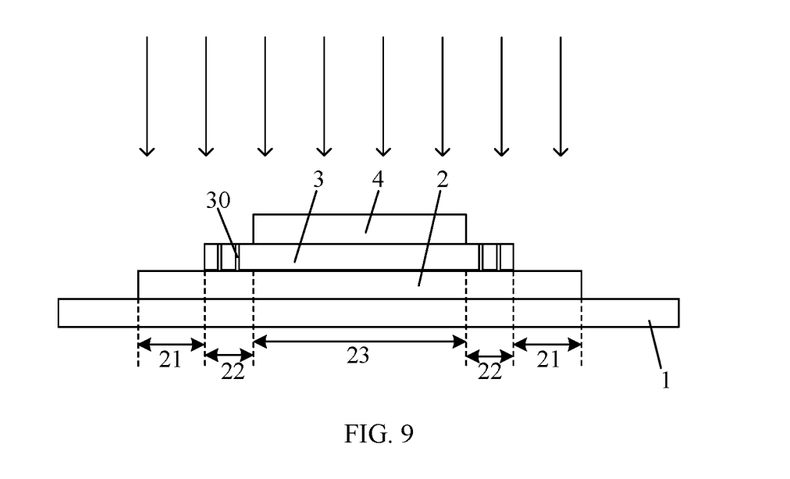
FIG. 9 is a cross-sectional view of a structure of the transistor after completion of step S07 in the method for fabricating the transistor according to the embodiment of the present disclosure.

In step S07, as shown in FIG. 9, the active layer 2 is ion-implanted from the side of the gate electrode 4 away from the active layer 2, to form the heavily doped region 21, the lightly doped region 22, and the active region 23 in the active layer 2.

In this step, no ions are implanted into a portion of the active layer shielded by both the gate electrode 4 and the gate insulating layer 3 to form the active region 23; ions are partially implanted into a portion of the active layer that is shielded by the gate insulating layer 3 but not shielded by the gate electrode 4 to form the lightly doped region 22; ions are sufficiently implanted into a portion of the active layer that is not shielded by the gate electrode 4 and the gate insulating layer 3 and is completely exposed to form the heavily doped region 21.

Figure 10:
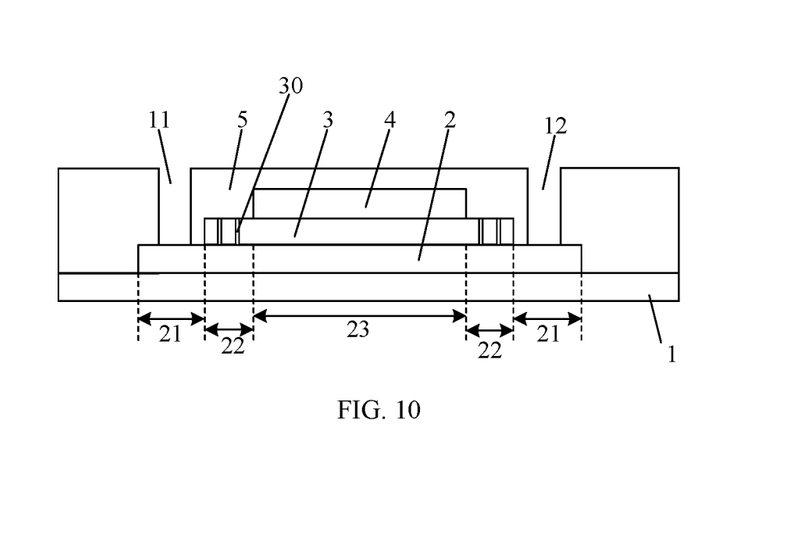
FIG. 10 is a cross-sectional view of a structure of the transistor after completion of step S08 in the method for fabricating the transistor according to the embodiment of the present disclosure.

In step S08, as shown in FIG. 10, the interlayer insulating layer 5 is formed on the side of the gate electrode 4 away from the active layer 2, and the first and second via holes 11 and 12 are formed in the interlayer insulating layer 5, and the heavily doped region 21 is exposed by the first and second via holes 11 and 12.

Figure 11:
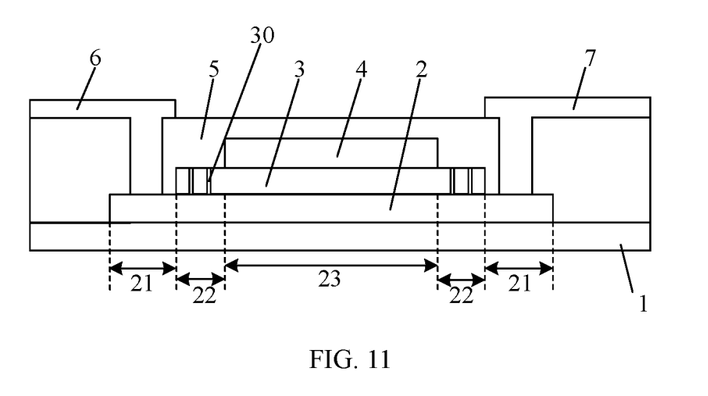
FIG. 11 is a cross-sectional view of a structure of the transistor after completion of step S09 in the method for fabricating the transistor according to the embodiment of the present disclosure.

In step S09, as shown in FIG. 11, the source electrode 6 and the drain electrode 7 are formed on the side of the interlayer insulating layer 5 away from the gate electrode 4, the source electrode 6 is connected to the heavily doped region 21 through the first via hole 11, and the drain electrode 7 is connected to the heavily doped region 21 through the second via hole 12.

An existing process may be adopted to form each film layer in the above steps S01-S09, which will not be described herein.

Based on the above method for fabricating the thin film transistor, the embodiments further provide a thin film transistor fabricated by the above fabrication method. As shown in FIG. 2, the thin film transistor includes: a substrate 1; an active layer 2 on the substrate 1, the active layer 2 including a heavily doped region 21, a lightly doped region 22, and an active region 23; a gate insulating layer 3 on a side of the active layer 2 away from the substrate 1; and a gate electrode 4 on a side of the gate insulating layer 3 away from the active layer 2. An orthographic projection of the heavily doped region 21 on the substrate 1 does not overlap with an orthographic projection of the gate insulating layer 3 on the substrate 1 and an orthographic projection of the gate electrode 4 on the substrate 1, an orthographic projection of the lightly doped region 21 on the substrate 1 overlaps with the orthographic projection of the gate insulating layer 3 on the substrate 1, but does not overlap with the orthographic projection of the gate electrode 4 on the substrate 1, and an orthographic projection of the active region 23 on the substrate 1 overlaps with both the orthographic projection of the gate insulating layer 3 on the substrate 1 and the orthographic projection of the gate electrode 4 on the substrate 1. The common boundary of the lightly doped region 22 and the active region 23 is aligned with one boundary of the gate electrode 4, and the common boundary of the heavily doped region 21 and the lightly doped region 22 is aligned with one boundary of the gate insulating layer 3. The active layer 2 includes two lightly doped regions 22 respectively disposed at two opposite ends of the active region 23, and the active layer 2 includes two heavily doped regions 21 respectively disposed at sides of the lightly doped regions 22 away from the active region 23. In some embodiments, the thin film transistor further includes: an interlayer insulating layer 5 on a side of the gate electrode 4 away from the active layer 2, a first via hole 11 and a second via hole 12 being disposed in the interlayer insulating layer 5 and exposing the heavily doped region 21; and a source electrode 6 and a drain electrode 7 on a side of the interlayer insulating layer 5 away from the gate electrode 4, the source electrode 6 being connected to the heavily doped region 21 through the first via hole 11, and the drain electrode 6 being connected to the heavily doped region 21 through the second via hole 12.

In some embodiments, the gate insulating layer 3 is provided with a plurality of through holes 30 in a region corresponding to the lightly doped region 22, and an aperture of the through holes 30 is in a range of 1 to 4 μm. The plurality of through holes 30 are uniformly distributed, and a total open area of all of the through holes 30 is less than 30% of an area of the lightly doped region 22.

In the method for fabricating a thin film transistor according to the embodiments of the present disclosure, by performing ion implantation on the active layer from the side of the gate electrode facing away from the active layer after the gate electrode is formed and before the interlayer insulating layer is formed, the heavily doped region, the lightly doped region, and the active region of the active layer can be simultaneously formed using the gate electrode and the gate insulating layer that have been formed as a mask; compared with the case that the heavily doped region and the lightly doped region of the thin film transistor need to be formed respectively through different doping processes, the fabrication process of the thin film transistor is greatly simplified, and the fabrication efficiency of the thin film transistor is improved.

The embodiments of the present disclosure also provide a method for fabricating an array substrate, which includes forming a thin film transistor in the array substrate by using the method for fabricating a thin film transistor according to the embodiments of the present disclosure.

In the embodiment, after the thin film transistor is formed, the method further includes: sequentially forming a passivation layer and a pixel electrode on a side of the thin film transistor away from the substrate. Forming the passivation layer includes forming a third via hole in the passivation layer, and the pixel electrode is connected to the drain electrode of the thin film transistor through the third via hole.

Based on the above method for fabricating the array substrate, the embodiments of the present disclosure further provide an array substrate including the thin film transistor according to the embodiments of the present disclosure.

In addition, in the embodiment, the array substrate further includes a passivation layer and a pixel electrode disposed on a side of the thin film transistor away from the substrate, the passivation layer and the pixel electrode are sequentially disposed in a direction away from the thin film transistor, a third via hole is formed in the passivation layer, and the pixel electrode is connected to the drain electrode of the thin film transistor through the third via hole.

In the method for fabricating the array substrate according to the embodiments of the present disclosure, the thin film transistor in the array substrate is formed by adopting the method for fabricating the thin film transistor according to the embodiments of the present disclosure, so that the fabrication process of the array substrate is greatly simplified, and the fabrication efficiency of the array substrate is improved.

The embodiments of the present disclosure also provide a display panel including the array substrate according to the embodiments of the present disclosure.

By adopting the array substrate according to the embodiments of the present disclosure, the fabrication process of the display panel is greatly simplified, so that the fabrication efficiency of the display panel is improved.

The display panel according to the present disclosure may be any product or component having a display function, such as an LCD panel, an LCD television, an OLED panel, an OLED television, a display, a mobile phone, a navigator, or the like.

It could be understood that the above embodiments are merely exemplary embodiments adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

What is claimed is:

1. A method for fabricating a thin film transistor, comprising: forming an active layer on a substrate, the active layer comprising a first region, a second region, and a third region; forming a gate insulating layer on a side of the active layer away from the substrate; forming a gate electrode on a side of the gate insulating layer away from the active layer, wherein an orthographic projection of the first region of the active layer on the substrate does not overlap with an orthographic projection of the gate insulating layer on the substrate and an orthographic projection of the gate electrode on the substrate, an orthographic projection of the second region of the active layer on the substrate overlaps with the orthographic projection of the gate insulating layer on the substrate but does not overlap with the orthographic projection of the gate electrode on the substrate, and an orthographic projection of the third region of the active layer on the substrate overlaps with both the orthographic projection of the gate insulating layer on the substrate and the orthographic projection of the gate electrode on the substrate; and performing ion implantation on the active layer from a side of the gate electrode away from the active layer, so that the first region of the active layer is formed into a heavily doped region, the second region of the active layer is formed into a lightly doped region, and the third region of the active layer is formed into an active region; wherein forming the gate insulating layer further comprises forming a plurality of through holes penetrating the gate insulating layer in a region of the gate insulating layer not overlapping with the gate electrode in a direction perpendicular to the substrate, and the plurality of through holes have an aperture in a range of 1 to 4 μm.

2. The method of claim 1, wherein an energy of the ion implantation is 10 to 100 KeV, and a dose of the ion implantation is less than $2\times10^{18}$ atom/cm$^3$.

3. The method of claim 1, wherein a doping concentration of the lightly doped region ranges from $1\times10^{12}$ to $1\times10^{14}$ atom/cm$^2$, and a doping concentration of the heavily doped region ranges from $1\times10^{14}$ to $1\times10^{16}$ atom/cm$^2$.

4. The method of claim 1, wherein the active layer is made of low temperature polysilicon.

5. The method of claim 1, wherein the plurality of through holes are uniformly distributed, and a total open area of all the through holes is less than 30% of an area of the lightly doped region.

6. The method of claim 1, wherein a width between a boundary of the lightly doped region close to the active region and a boundary of the lightly doped region close to the heavily doped region ranges from 1.5 to 6 μm.

7. The method of claim 1, wherein a common boundary between the lightly doped region and the active region is formed to be aligned with a boundary of the gate electrode.

8. The method of claim 1, wherein a common boundary between the heavily doped region and the lightly doped region is formed to be aligned with a boundary of the gate insulating layer.

9. The method of claim 1, wherein the gate electrode is made of one or an alloy material of two or more of copper, aluminum, molybdenum, titanium, chromium and tungsten; the gate insulating layer is made of silicon nitride or silicon oxide.

10. The method of claim 4, wherein forming the active layer on the substrate comprises:

forming a pattern of an amorphous silicon active film on the substrate; and crystallizing the pattern of the amorphous silicon active film by laser to form the active layer of low temperature polysilicon.

11. The method of claim 1, wherein forming the gate insulating layer on the side of the active layer away from the substrate, and forming the gate electrode on the side of the gate insulating layer away from the active layer comprise:

forming a gate insulating film on the side of the active layer away from the substrate;

forming a gate film on a side of the gate insulating film away from the active layer;

forming a first photoresist layer on a side of the gate film away from the gate insulating film;

etching the gate film and the gate insulating film to remove portions of the gate film and the gate insulating film which are not shielded by the first photoresist layer so as to form the gate insulating layer;

forming a second photoresist layer on the side of the gate film away from the gate insulating layer; and etching the gate film to remove a portion of the gate film which is not shielded by the second photoresist layer so as to form the gate electrode.

12. The method of claim 11, further comprising:

forming a third photoresist layer on a side of the gate electrode away from the gate insulating layer, wherein a plurality of micro holes are formed in a region of the third photoresist layer which overlaps with the lightly doped region in a direction perpendicular to the substrate; and etching the gate insulating layer to form a plurality of through holes penetrating the gate insulating layer in a region of the gate insulating layer which does not overlap with the gate electrode in the direction perpendicular to the substrate.

13. The method of claim 12, wherein after the ion implantation is performed, the method further comprises:

forming an interlayer insulating layer on the side of the gate electrode away from the active layer, and forming a first via hole and a second via hole in the interlayer insulating layer, wherein the first via hole and the second via hole expose the heavily doped region; and forming a source electrode and a drain electrode on a side of the interlayer insulating layer away from the gate electrode, wherein the source electrode is connected to the heavily doped region through the first via hole, and the drain electrode is connected to the heavily doped region through the second via hole.

14. A thin film transistor, comprising: a substrate; an active layer on the substrate, the active layer comprising a heavily doped region, a lightly doped region, and an active region; a gate insulating layer on a side of the active layer away from the substrate; and a gate electrode on a side of the gate insulating layer away from the active layer, wherein an orthographic projection of the heavily doped region on the substrate does not overlap with an orthographic projection of the gate insulating layer on the substrate and an orthographic projection of the gate electrode on the substrate, an orthographic projection of the lightly doped region on the substrate overlaps with the orthographic projection of the gate insulating layer on the substrate but does not overlap with the orthographic projection of the gate electrode on the substrate, and an orthographic projection of the active region on the substrate overlaps with both the orthographic projection of the gate insulating layer on the substrate and the orthographic projection of the gate electrode on the substrate, and a common boundary between the lightly doped region and the active region is aligned with a boundary of the gate electrode, and a common boundary between the heavily doped region and the lightly doped region is aligned with a boundary of the gate insulating layer; wherein the gate insulating layer further comprises a plurality of through holes penetrating the gate insulating layer in a region of the gate insulating layer not overlapping with the gate electrode in a direction perpendicular to the substrate, and the plurality of through holes have an aperture in a range of 1 to 4 μm.

15. The thin film transistor of claim 14, wherein a doping concentration of the lightly doped region ranges from $1 \times 10^{12}$ to $1 \times 10^{14}$ atom/cm$^2$, and a doping concentration of the heavily doped region ranges from $1 \times 10^{14}$ to $1 \times 10^{16}$ atom/cm$^2$.

16. The thin film transistor of claim 14, further comprising:

an interlayer insulating layer on a side of the gate electrode away from the active layer, a first via hole and a second via hole being in the interlayer insulating layer and exposing the heavily doped region, and a source electrode and a drain electrode on a side of the interlayer insulating layer away from the gate electrode, wherein the source electrode is connected to the heavily doped region through the first via hole, and the drain electrode is connected to the heavily doped region through the second via hole.

17. A method for fabricating an array substrate, comprising:

forming a thin film transistor in the array substrate by adopting the method of claim 1.

18. An array substrate, comprising the thin film transistor of claim 14.

19. A display panel, comprising the array substrate of claim 18.

* * * * *